United States Patent [19]
Hwang

[11] Patent Number: 5,889,708
[45] Date of Patent: Mar. 30, 1999

[54] DATA READING CIRCUIT FOR SEMICONDUCTOR MEMORY DEVICE

[75] Inventor: Myoung-Ha Hwang, Cheongju, Rep. of Korea

[73] Assignee: LG Semicon Co., Ltd., Cheongju, Rep. of Korea

[21] Appl. No.: 40,947

[22] Filed: Mar. 19, 1998

[30] Foreign Application Priority Data

May 21, 1997 [KR] Rep. of Korea .................. 1997/19703

[51] Int. Cl.⁶ ....................................................... G11C 7/00
[52] U.S. Cl. ............................... 365/189.07; 365/189.05; 365/194; 365/207
[58] Field of Search ........................ 365/189.05, 189.07, 365/194, 207, 208, 233.5

[56] References Cited

U.S. PATENT DOCUMENTS

| | | | |
|---|---|---|---|
| 5,696,719 | 12/1997 | Baek et al. | 365/207 |
| 5,696,724 | 12/1997 | Koh et al. | 365/205 |
| 5,708,607 | 1/1998 | Lee et al. | 365/207 |
| 5,740,112 | 4/1998 | Tanaka et al. | 365/185.21 |

*Primary Examiner*—Son T. Dinh
*Attorney, Agent, or Firm*—Fleshner & Kim

[57] ABSTRACT

A data reading circuit for a semiconductor memory device which is capable of obtaining a desired characteristic of a high speed latching sense amplifier and by which the circuit is stably operated even when a noise is inputted. The circuit includes a latching sense amplifier and a current mirror type sense amplifier for receiving output data DATA and DATAB from a memory cell array, a signal delay unit for delaying an output signal S0 from the latching sense amplifier, a comparing unit for comparing an output signal DEO from the signal delay unit with an output signal SOM from the current mirror type sense amplifier, a pulse generator for receiving an output signal COM from the comparing unit and outputting a pulse signal DLD, a controller for outputting sense amplifier control signals for driving the current mirror type sense amplifier, and a combination unit for outputting latching sense amplifier control signals for driving the latching sense amplifier.

14 Claims, 10 Drawing Sheets

DATA READING CIRCUIT FOR SEMICONDUCTOR MEMORY DEVICE

BACKGROUND OF THE INVENTION

1. Field of the Invention

The present invention relates to a data reading circuit for a semiconductor memory device, and in particular to an improved data reading circuit for a semiconductor memory device which is capable of enhancing the characteristic of a high speed latching sense amplifier by using both a latching sense amplifier and a current mirror type sense amplifier and by which the data reading circuit is more stably operated with respect to input noise.

2. Description of the Conventional Art

FIG. 1 illustrates a conventional data reading circuit for a semiconductor memory device, which includes a decoder 1 receiving and decoding applied address signals ADD0 and ADD1, a memory cell array 2 accessed by the signals CA0 and CA1 outputted from the decoder 1, a controller 3 receiving address transition detection signals ATD0 and ATD1 generated upon detecting transitions of the address signals ADD0 and ADD1, and a latching sense amplifier 4 receiving signals EQ and EN outputted from the controller 3 and data DATA and DATAB outputted from the memory cell array 2 and outputting an output signal S0.

The operation of the conventional data reading circuit for a semiconductor memory device will now be explained with reference to the accompanying drawings.

First, as shown in FIG. 2, when the address signal ADD0 is inputted to the decoder 1, it is decoded thereby and a corresponding cell access signal CA0 is generated and is outputted to the memory cell array 2.

The data signal stored in memory cell array 2 is thereby read out in response to the cell access signal CA0 and is applied to the latching sense amplifier 4.

The controller 3 receives the address transition detection signal ATD0 which is generated upon the transition of the address signal ADD0 and outputs a sense amplifier enable signal EN and a sense amplifier equalization signal EQ, respectively.

The latching sense amplifier 4 receives the sense amplifier control signals EN and EQ from the controller 3 for being equalized and enabled in accordance therewith, and receives the data signals DATA and DATAB and outputs an output signal S0.

In the conventional data reading circuit for a semiconductor memory device, the latching sense amplifier 4 is used for increasing the reliability of the data reading operation. However, as shown in FIG. 3, if a short noise pulse signal masquerading as an address signal ADD1 is inputted into the chip, the cell access signal CA1 inadvertently is generated due to the noise signal, so that an incorrect cell may be accessed. Therefore, even when the cell access signal CA0 is inputted, the corresponding data signal may not be selected. Namely, an incorrect cell data may be carried on a bit line, or the equalization may be terminated by the cell amplifier equalization signal EQ before a predetermined data is substantially carried on the bit line.

In addition, when the latching sense amplifier 4 is enabled by the sense amplifier enable signal EN, since the latching sense amplifier 4 latches an incorrect data, even when the correct data is then inputted to the latch sense amplifier 4 later, it is impossible to output the correct data again. Namely, the incorrect data is continuously outputted, thus causing a malfunction of the memory device.

SUMMARY OF THE INVENTION

Accordingly, it is an object of the present invention to provide a data reading circuit for a semiconductor device which overcomes the aforementioned problems encountered in the conventional art.

It is another object of the present invention to provide a data reading circuit for a semiconductor device which is capable of obtaining a desired characteristic of a high speed latch sense amplifier and by which the chip is stably operated even when a noise is inputted to the chip.

To achieve the above objects, there is provided a data reading circuit for a semiconductor device which includes a latch sense amplifier and a current mirror type sense amplifier for receiving output data DATA and DATAB from a memory cell array, a signal delay means for delaying an output S0 from the latch sense amplifier, a comparing means for comparing an output DEO from the signal delay means with an output SOM from the current mirror type sense amplifier, a pulse generator for receiving an output COM from the comparing means and outputting a pulse signal DLD, a controller for outputting a sense amplifier control signal for driving the current mirror type sense amplifier, and a combination unit for outputting a latch sense amplifier control signal for driving the latch sense amplifier.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
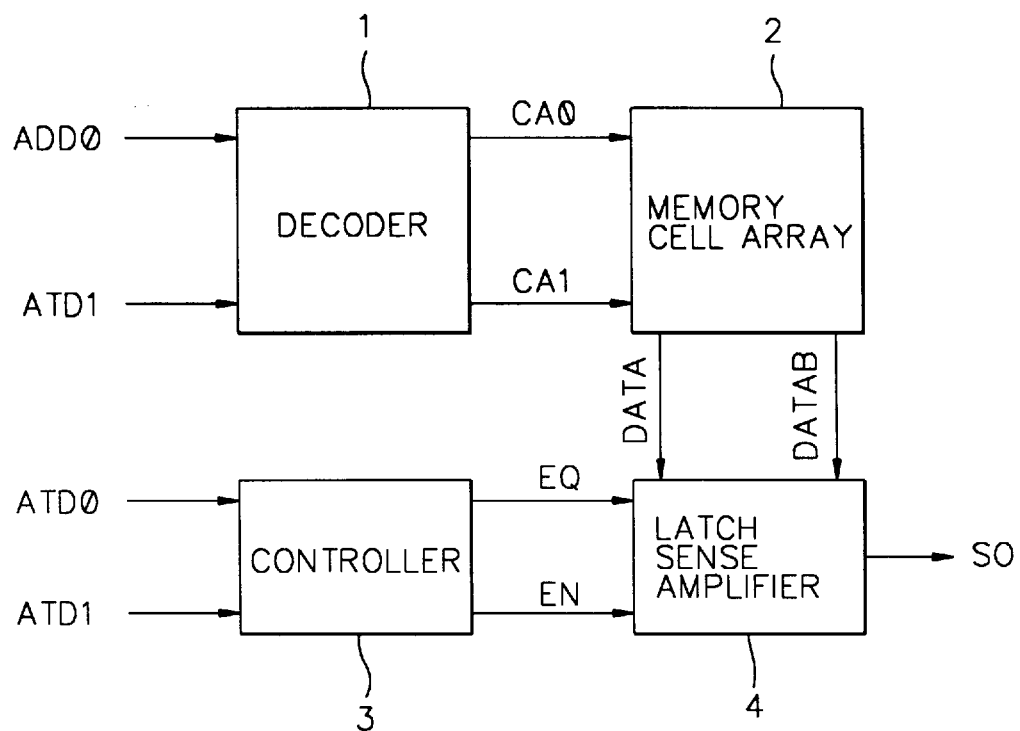
FIG. 1 is a block diagram illustrating a conventional data reading circuit for a semiconductor memory device.
Figure 2:
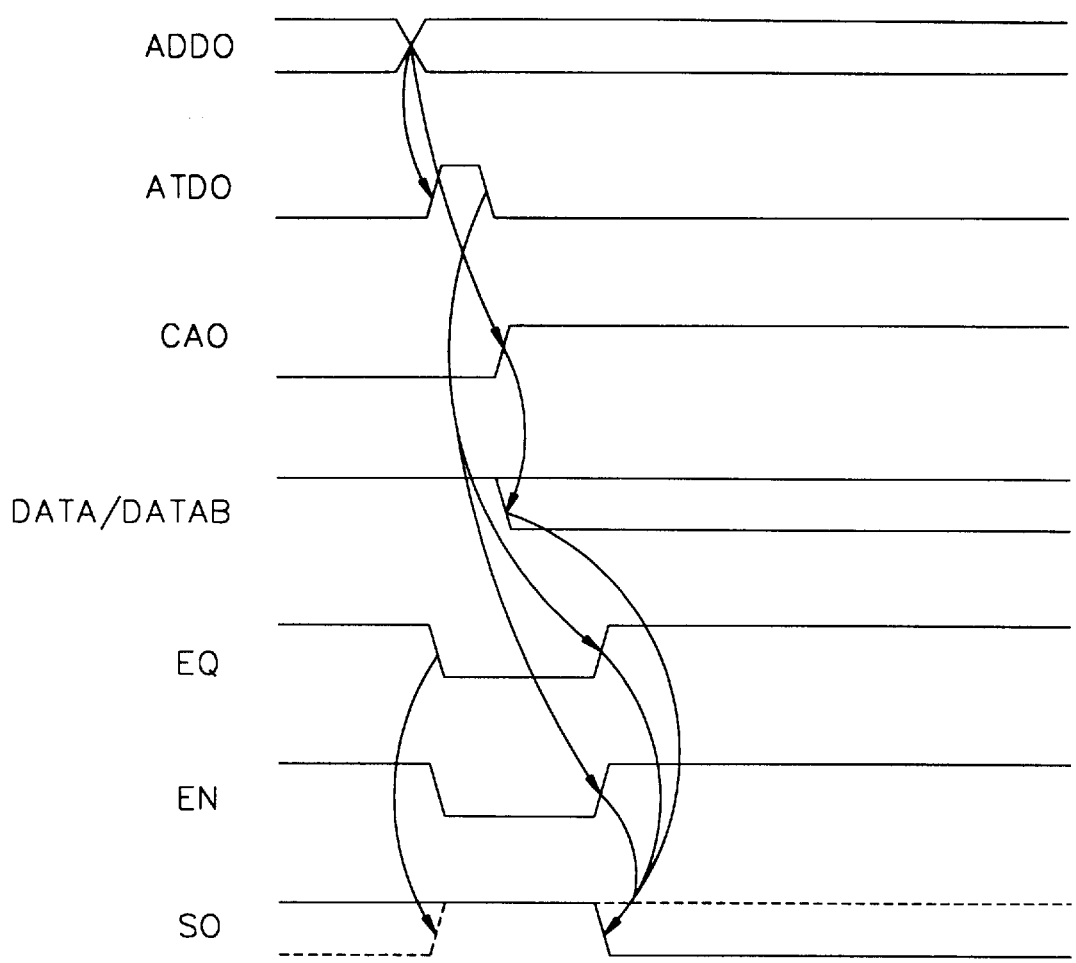
FIG. 2 is a timing diagram of operational signals when the circuit of FIG. 1 is normally operated.
Figure 3:
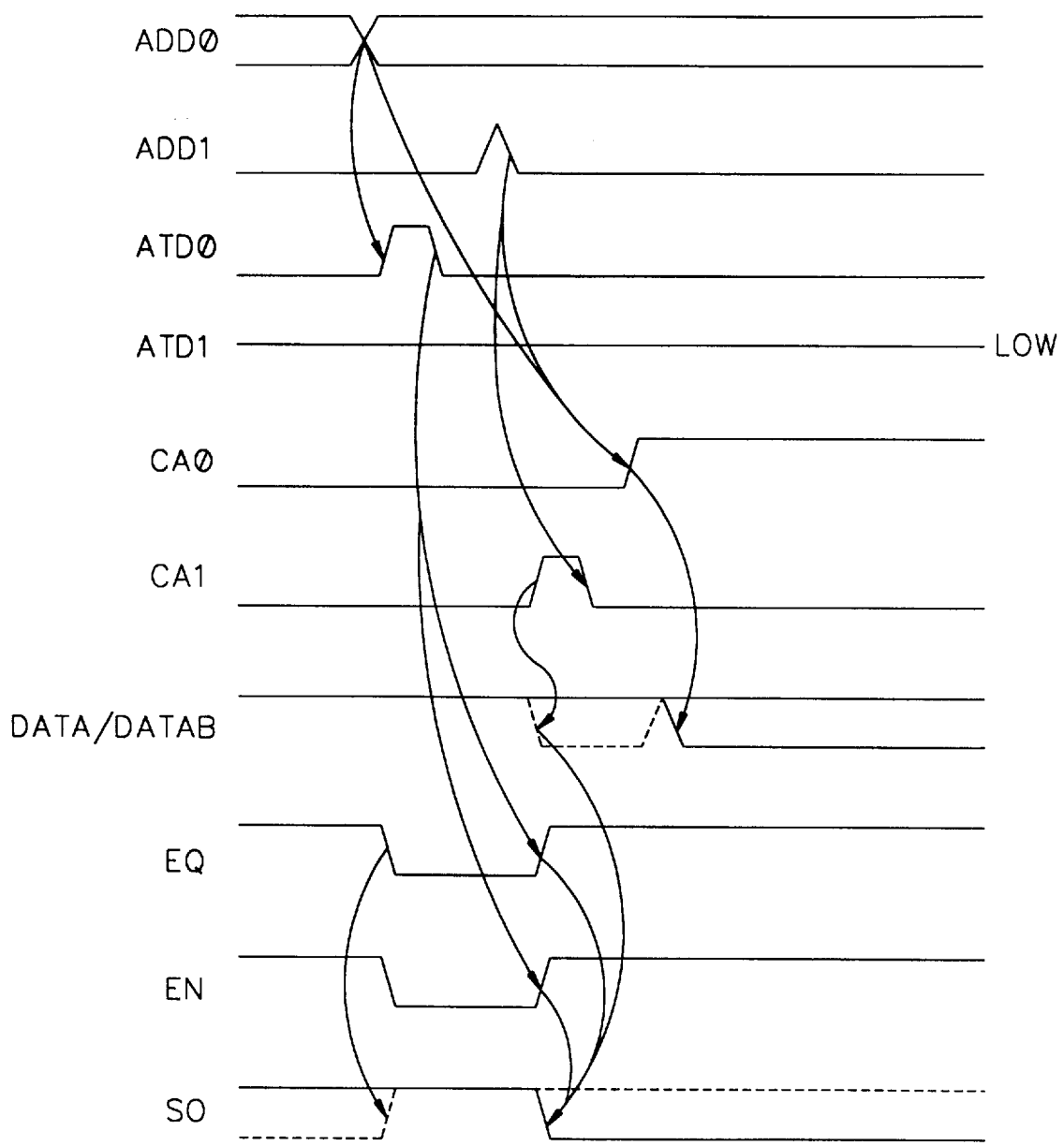
FIG. 3 is a timing diagram of operational signals when noise occurs in the circuit of FIG. 1.
Figure 4:
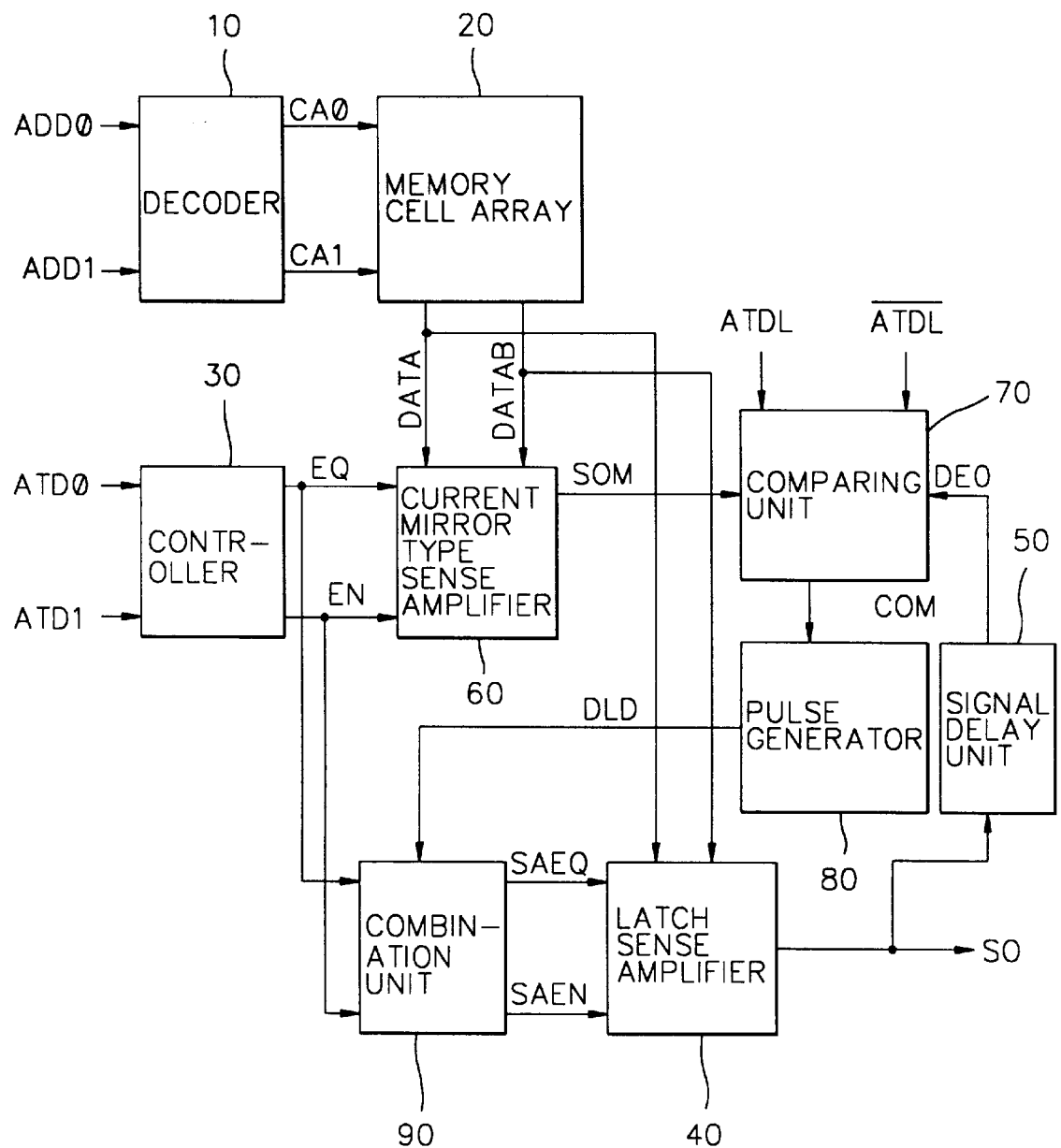
FIG. 4 is a block diagram illustrating a data reading circuit for a semiconductor memory device according to the present invention.

FIG. 4 illustrates the data reading circuit for a semiconductor memory device according to the present invention, which, as shown therein, includes a decoder 10 receiving and decoding respective address signals ADD0 and ADD1 and generating corresponding respective cell access signals CA0 and CA1, a memory cell array 20 receiving the cell access signals CA0 and CA1 outputted from the decoder 10, a controller 30 receiving address transition detection signals ATD0 and ATD1 which are generated upon and indicate transitions in the address signals ADD0 and ADD1 and accordingly outputting sense amplifier control signals EQ and is EN, a latching sense amplifier 40 and a current mirror type sense amplifier 60 each receiving output data signals DATA and DATAB from the memory cell array 20 and accordingly outputting data signal SO and SOM, respectively, a signal delay unit 50 for delaying the signal SO outputted from the latching sense amplifier 40 to output a delayed signal DEO, a comparing unit 70 for comparing the delayed signal DEO outputted from the signal delay unit 50 with the output signal SOM from the current mirror type sense amplifier 60 in response to control signals ATDL and /ATDL and outputting a comparison signal COM in accordance with such comparison, a pulse generator 80 for receiving the comparison signal COM outputted from the comparing unit 70 and outputting a pulse signal DLD in response thereto, a controller 30 outputting sense amplifier control signal for driving the current mirror type sense amplifier 60, and a combination unit 90 outputting latching sense amplifier control signals for driving the latching sense amplifier 40. Here, the sense amplifier control signals applied to current mirror type sense amplifier 60 consist of a sense amplifier equalization signal EQ and a sense amplifier enable signal EN, and the latching sense amplifier control signals applied to latching sense amplifier 40 consist of a latching sense amplifier equalization signal SAEQ and a latching sense amplifier enable signal SAEN.

Figure 5:
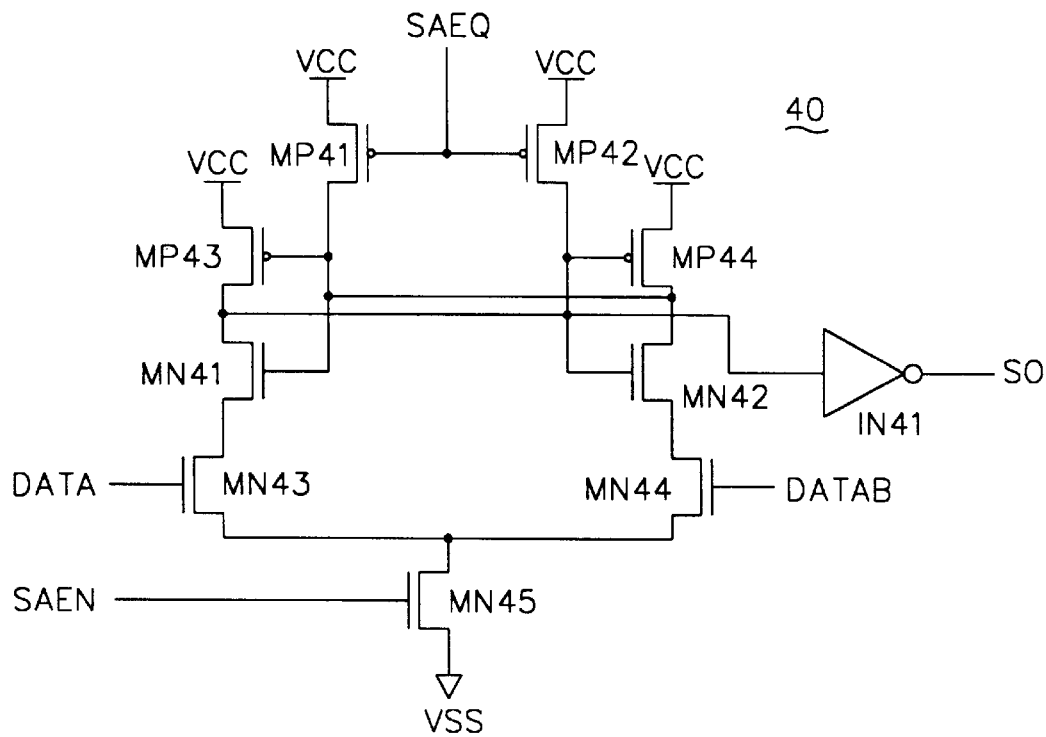
FIG. 5 is a detailed circuit diagram illustrating a latching sense amplifier in the circuit of FIG. 4.

As shown in FIG. 5, the latching sense amplifier 40 includes PMOS transistors MP41 and MP42 the commonly connected gates of which respectively receive the latching sense amplifier equalization signal SAEQ, and the sources of which respectively receive an externally supplied voltage VCC; PMOS transistors MP43 and MP44 the gates of which are respectively connected with the drains of the PMOS transistors MP41 and MP42, and the sources of which respectively receive the supply voltage VCC; an NMOS transistor MN41 the drain of which is connected with the drain of the PMOS transistor MP43, and the gate of which is commonly connected with the drain of the PMOS transistor MP41, the gate of the PMOS transistor MP43, and the drain of the PMOS transistor MP44, respectively; an NMOS transistor MN42 the drain of which is connected with the drain of the PMOS transistor MP44, and the gate of which is commonly connected with the drain of the PMOS transistor MP42, the gate of the PMOS transistor MP44, the drain of the PMOS transistor MP43, and the drain of the NMOS transistor MN41, respectively; NMOS transistors MN43 and MN44 to the gates of which are respectively applied the output data signals DATA and DATAB from the memory cell array 20, and the respective drains of which are connected with the respective sources of the NMOS transistors MN41 and MN42; an NMOS transistor MN45 to the gate of which is applied the latching sense amplifier enable signal SAEN from the combination unit 90, the drain of which is connected commonly with the respective sources of the NMOS transistors MN43 and MN44, and the source of which is connected to a ground voltage VSS; and an inverter IN41, the input terminal of which is commonly connected with the respective gates of the PMOS transistor MP44 and the NMOS transistor MN42 and with the respective drains of PMOS transistors MP42 and MP43 and NMOS transistor MN41, for outputting the output signal SO.

Figure 6:
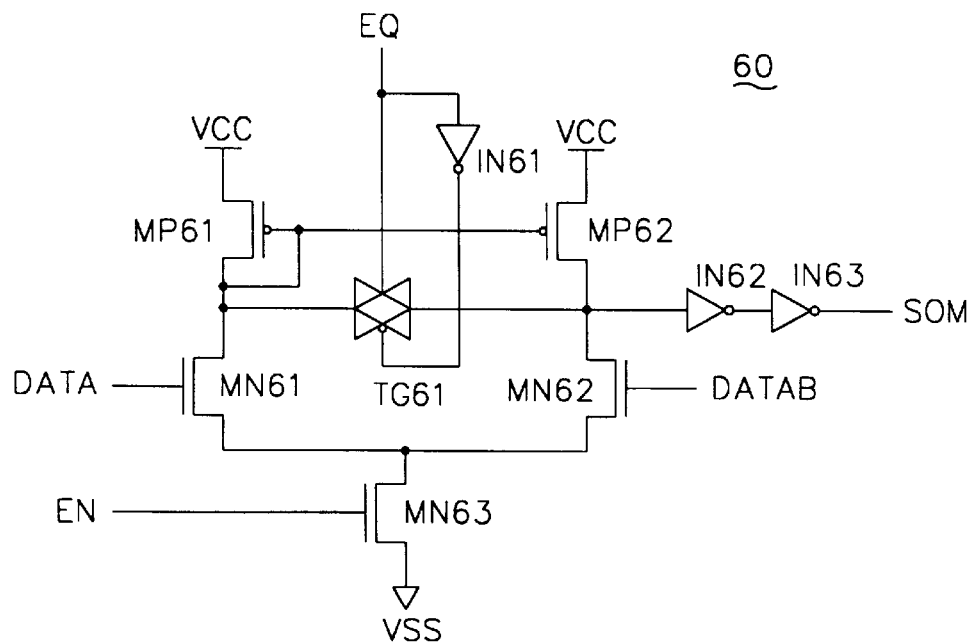
FIG. 6 is a detailed circuit diagram illustrating a current mirror type sense amplifier in the circuit of FIG. 4.

As shown in FIG. 6, the current mirror type sense amplifier 60 includes: a PMOS transistor MP61 the gate of which is connected with the drain thereof, and the source of which receives the supply voltage VCC; a PMOS transistor MP62 the gate of which is connected with the gate of the PMOS transistor MP61, and the source of which receives the supply voltage VCC; an inverter IN61 for inverting the sense amplifier equalization signal EQ from controller 30; a transmission gate TG61 controlled in accordance with the sense amplifier equalization signal EQ and the inverted version of the sense amplifier equalization signal EQ from the inverter IN61 and connected between the drains of the PMOS transistors MP61 and MP62; NMOS transistors MN61 and MN62 to the respective gates of which are also applied the output data signals DATA and DATAB from the memory cell array 20 and the respective drains of which are connected to the drains of the PMOS transistors MP61 and MP62, respectively; an NMOS transistor MN63 to the gate of which is applied the sense amplifier enable signal EN from the controller 30, the drain of which is commonly connected with the respective sources of the NMOS transistors MN61 and MN62, and the source of which is connected with the ground voltage VSS; and inverters IN62 and IN63 which are commonly connected in series with the drains of the PMOS transistor MP62 and the NMOS transistor MN62 and through the transmission gate TG61 with the drain of PMOS transistor MP61 and NMOS transistor MN61 and outputting therethrough the output signal SOM.

Figure 7A:
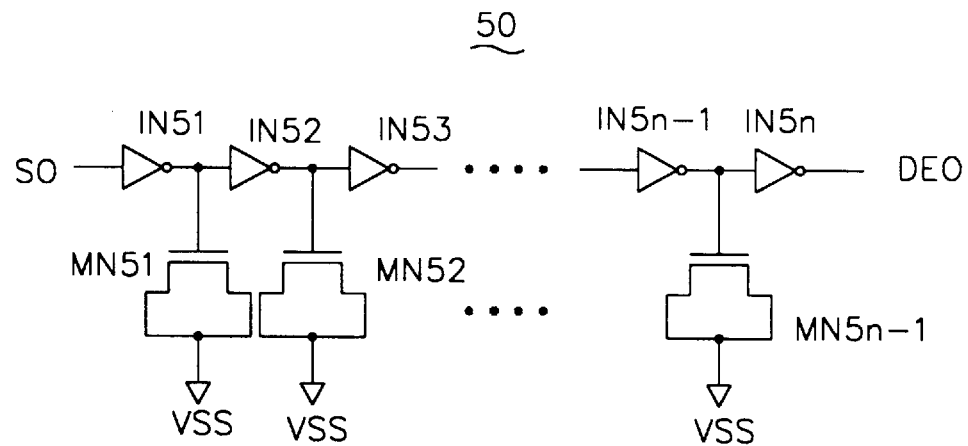
FIGS. 7A and 7B are circuit diagrams illustrating a delay unit in the circuit of FIG. 4.

As shown in FIG. 7A, the signal delay unit 50 includes a plurality of inverters IN51 through IN5n which are connected in series with one another, and between each of which is connected the gate of a respective one of a plurality of NMOS transistors NM51 through MN5n−1 the respective source and drain of each of which is commonly connected with ground voltage VSS.

Figure 7B:
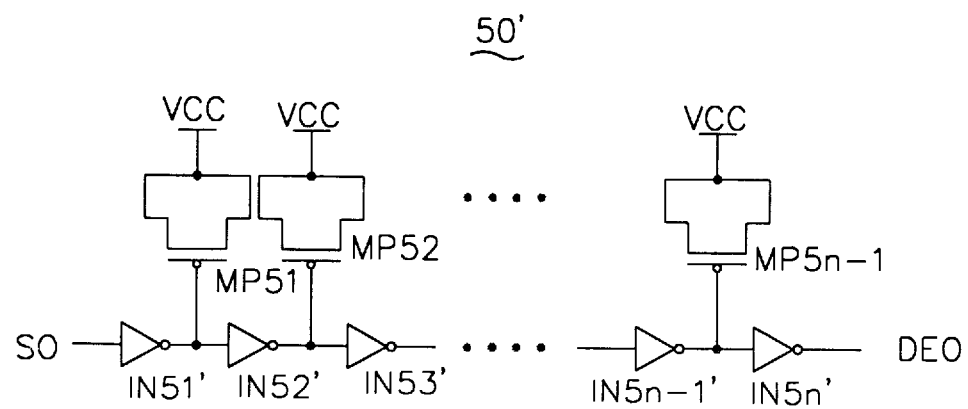

As shown in FIG. 7B, a signal delay unit 50' which is provided in accordance with another embodiment of the signal delay unit includes a plurality of inverters IN51'–IN5n' which are connected in series with one another, and between each of which is connected the gate of a respective one of a plurality of PMOS transistors MP51'–MP5n'−1 the respective source and drain of each of which is commonly connected with the supply voltage VCC.

Figure 8A:
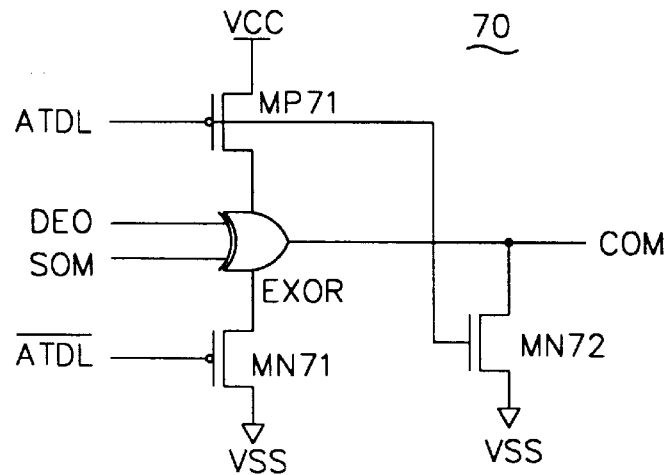
FIGS. 8A and 8B are circuit diagrams illustrating a comparator in the circuit of FIG. 4.

As shown in FIG. 8A, the comparing unit 70 includes: a PMOS transistor MP71 to the gate of which is applied to the control signal ATDL, and the source receives the supply voltage VCC; an NMOS transistor MN71 to the gate of which is applied the inverted version /ATDL of the control signal ATDL, and the source of which is connected with ground voltage VSS; a clocked exclusive OR-gate EXOR, at the respective input terminals of which receiving the delayed signal DEO outputted from the signal delay unit 50 and the signal SOM outputted from the current mirror type sense amplifier 60, respectively, and connected with at clock inputs thereof the drain of the PMOS transistor MP71 and the drain of the NMOS transistor MN71 and receiving and outputting an output signal COM; and an NMOS transistor MN72 to the gate of which is also applied the control signal ATDL, the drain of which is connected with the output terminal of the exclusive OR-gate EXOR, and the source of which is connected with the ground voltage VSS.

Figure 8B:
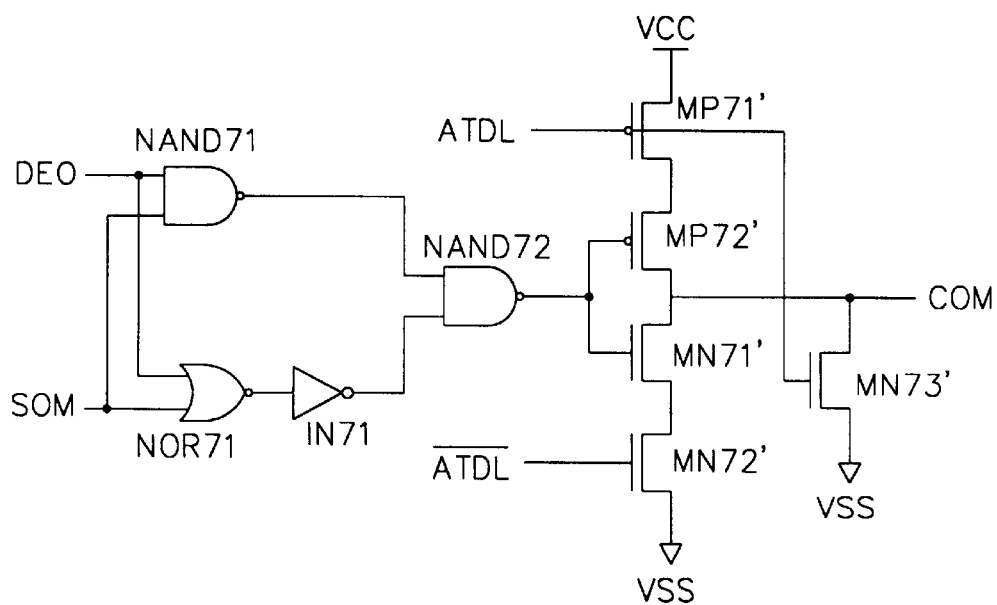

As shown in FIG. 8B, a comparing unit 70' which may be employed in accordance with another embodiment of the invention instead of the comparing unit 70 includes: a NAND-gate NAND71 and a NOR-gate NOR71 respectively NANDing and NORing the delayed signal DEO from the signal delay unit 50 and the signal SOM outputted from the current mirror type sense amplifier 60; an inverter IN71 inverting the output signal from the NOR-gate NOR71; a NAND-gate NAND72 NANDing the output signal from the NAND-gate NAND71 and the output signal from the inverter IN71; PMOS transistors MP71' and MP72' and NMOS transistors MN71' and MN72' connected in series between the supply voltage VCC and the ground voltage VSS, with the control signal ATDL being applied to the gate of PMOS transistor MP71', the output signal from the NAND-gate NAND72 being applied commonly to the gates of the PMOS transistor PM72' and the NMOS transistor NM71', and with the inverted control signal /ATDL being applied to the gate of the NMOS transistor NM72'; and an NMOS transistor MN73' to the gate of which is also applied the control signal ATDL, the source of which is connected with the ground voltage VSS, and the drain of which is commonly connected with the drains of the PMOS transistor MP72' and the NMOS transistor MN72'.

Figure 9:
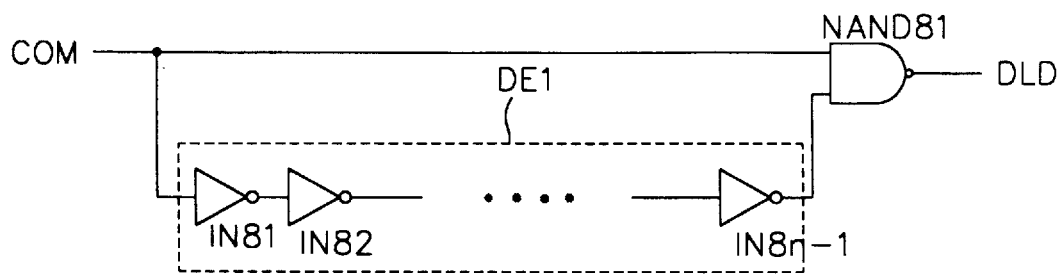
FIG. 9 is a circuit diagram illustrating a pulse generation unit in the circuit of FIG. 4.

As shown in FIG. 9, the pulse generator 80 includes a delay unit DE1 for delaying the comparison signal COM outputted from the comparing unit 70, and a NAND-gate NAND81 NANDing the comparison signal outputted from the comparing unit 70 and the output signal from the delay unit DE1 and outputting a signal pulse signal DLD.

Here, the delay unit DE1 is formed of a number (2n+1) of inverters IN81 through IN8n-1 connected in series.

Figure 10:
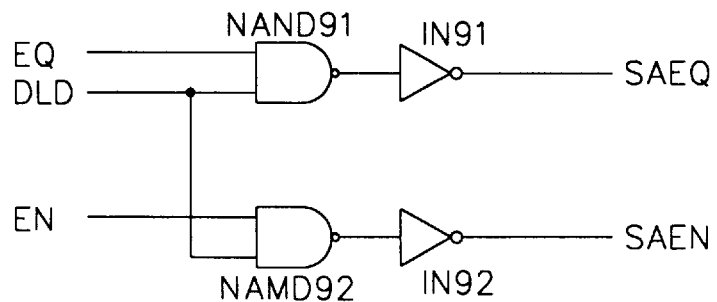
FIG. 10 is a detailed circuit diagram illustrating a combination unit in the circuit of FIG. 4.

As shown in FIG. 10, the combination unit 90 includes: a NAND-gate NAND91 NANDing the pulse signal DLD outputted from the pulse generator 80 and the sense amplifier equalizing signal EQ; an inverter IN91 inverting the output signal from the NAND-gate NAND91 and outputting the latching sense amplifier equalization signal SAEQ; a NAND-gate NAND92 NANDing the sense amplifier enable signal EN and the pulse signal DLD outputted from the pulse generator 80; and an inverter IN92 inverting the output signal from the NAND-gate NAND92 and outputting the latching sense amplifier enable signal SAEN.

The operation of the above-described data reading circuit for a semiconductor memory device according to the present invention will now be explained with reference to the accompanying drawings.

Figure 11:
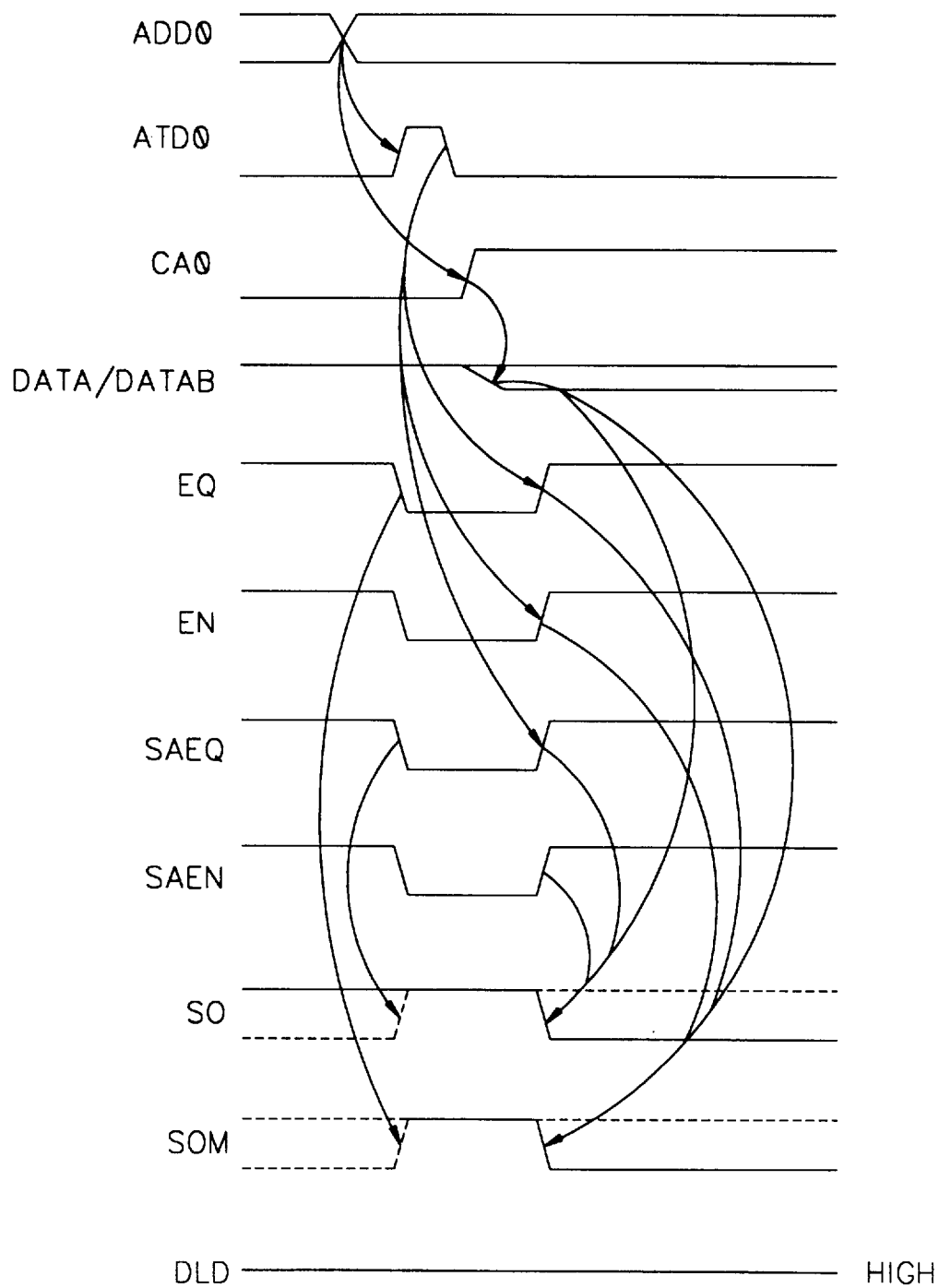
FIG. 11 is a timing diagram of operational signals when the circuit shown in FIG. 4 is normally operated according to the present invention.

First, as shown in FIG. 11, the operation wherein only normal address signal ADD0 is inputted (that is, where no noise is inputted) will now be explained.

When the address signal ADD0 inputted into the decoder 10 is transited, the is address transition detection signal ATD0 is generated.

Therefore, a cell access signal CA0 is generated in accordance with the address transition detection signal ATD0, thus accessing a desired cell, whereby accurate data signals DATA and DATAB are outputted.

In addition, when the address transition detection signal ATD0 is inputted into the controller 30, the sense amplifier control signals, namely, the sense amplifier equalization signal EQ and the sense amplifier enable signal EN are outputted. After the latching sense amplifier 40 and the current mirror type sense amplifier 60 are equalized and enabled in accordance with the sense amplifier control signals EQ and EN and SAEQ and SAEN, and the output signals SO and SOM are outputted in accordance with the data signals DATA and DATAB outputted from the memory cell array 20.

Thereafter, the signal delay unit 50 delays the output signal S0 from the latching sense amplifier 40 so that the timing of the output signal S0 from the latch sense amplifier 40 coincides with the timing of the output signal SOM from the current mirror type sense amplifier 60.

In addition, the comparing unit 70 compares the signal DEO which is the delayed output signal S0 from the latching sense amplifier 40 with the output signal SOM from the current mirror type sense amplifier 60. Here, since the delayed signal DEO which is generated by delayed the output signal S0 from the latching sense amplifier 40 is identical with the output signal SOM from the current mirror type sense amplifier 60, the comparison COM outputted from the comparing unit 70 becomes a low level. Therefore, since the pulse signals DLD outputted from the pulse generator 80 maintains a high level, the latching sense amplifier 40 constantly outputs the output data signal S0.

Figure 12:
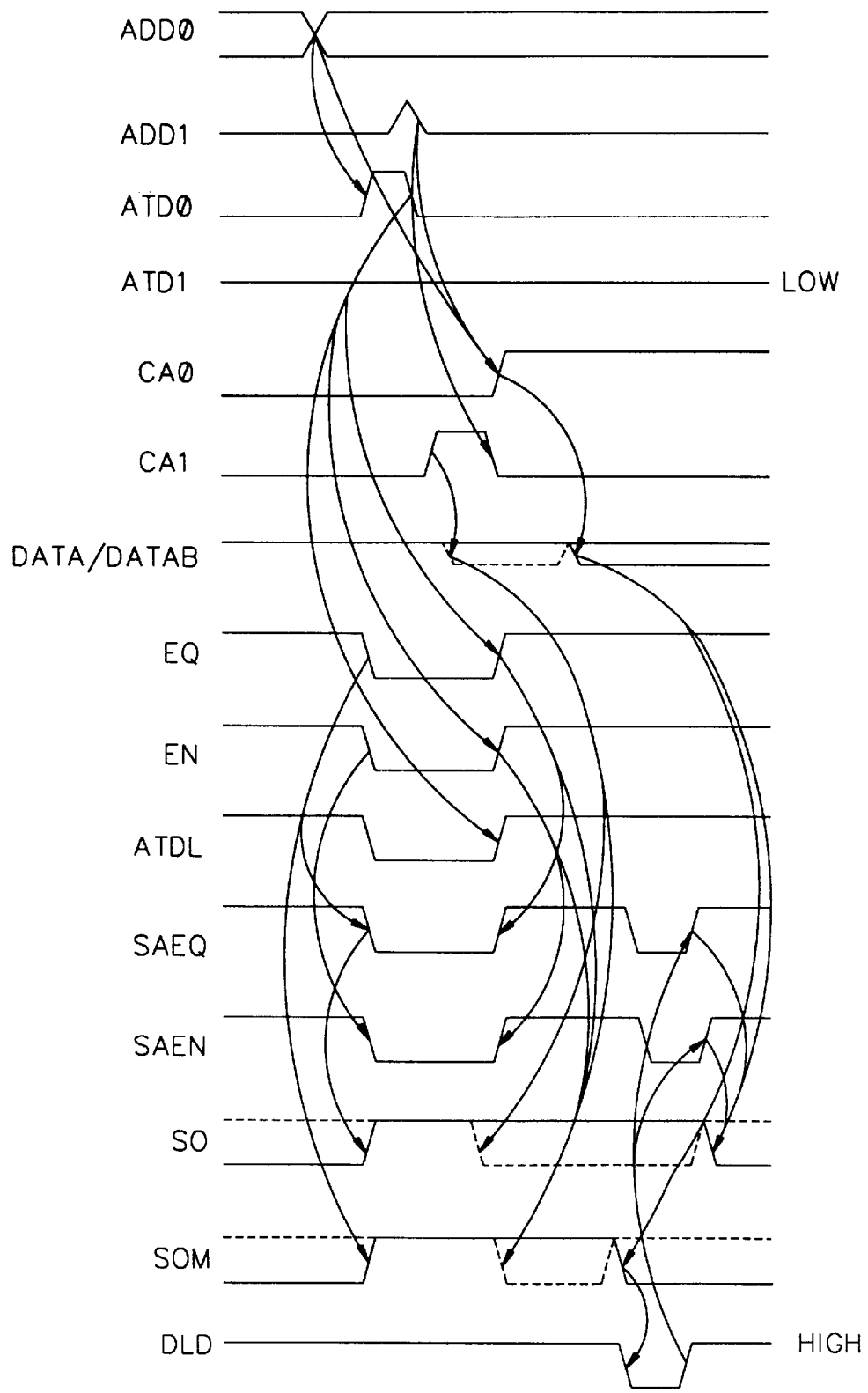
FIG. 12 is a timing diagram of operational signals when noise occurs in the circuit of FIG. 4 according to the present invention.

Next, as shown in FIG. 12, the case where the normal address signal ADD0 and s short noise pulse masquerading as the address are both inputted will be explained.

When the normal address signal ADD0, and the noise pulse signal ADD1 are both inputted into the decoder 10, the address transition detection signal ATD0 is normally outputted in accordance with the transition of the normal address signal ADD0. However, the address transition detection signal ATD1 is not outputted in response to the short noise pulse signal ADD1. Therefore, the generation of a desired cell access signal CA0 is delayed by the short noise pulse signal ADD1, and then does not coincide with the sense amplifier control signals EQ and EN.

In this case, although the latching sense amplifier 40 detects and latches an inaccurate cell data selected by the short noise pulse signal ADD1, since the output signal SOM from the current mirror type sense amplifier 60 detects and latches another cell data, the output signal SOM therefrom is different from the output signal S0 from the latching sense amplifier 40 and then the delayed signal DEO.

Therefore, the comparison signal COM outputted from the comparing unit 70 becomes a high level, and the pulse signal DLD is outputted by the pulse generator 80.

The combination unit 90 combines the pulse signal DLD and the sense amplifier control signals EQ and EN from the controller 30 and outputs the latching sense amplifier control signals, namely the latching sense amplifier equalization signal SAEQ and a latch sense amplifier enable signal SAEN to the latching sense amplifier 40.

The latching sense amplifier 40 receives the latching sense amplifier control signals SAEQ and SAEN and is thus equalized, and then is disabled and enabled. At this time, since an accurate data is carried on the data lines, the latching sense amplifier 40 senses and outputs an accurate data signal.

Here, the signal delay unit 50 connected to the latching sense amplifier 40 is provided in order to prevent a malfunction due to the output timing difference between the latching sense amplifier 40 and the current mirror type sense amplifier 60, and the control signals ATDL and /ATDL controlling the comparing unit 70 are used for enabling an accurate comparison between the data signals outputted from the latching sense amplifier 40 and from the current mirror type sense amplifier 60.

Therefore, even when the sense amplifier control signals EQ and EN and the cell access signal CA0 do not coincide with each other after the short noise pulse signal ADD1 is inputted, it is possible to prevent a malfunction of the data reading circuit.

As described above, in the data reading circuit for a semiconductor memory device according to the present invention, even when a short noise pulse is inputted which is miss-recognized as the address signal ADD1, and the latching sense amplifier 40 latches an inaccurate data, since the latching sense amplifier 40 and the current mirror type sense amplifier 60 are both used, the circuit is capable of reading a normal data by combining the outputs from these sense amplifiers and controlling the latching sense amplifier 40. Therefore, it is possible to obtain a characteristic of a high speed sense amplifier, and the circuit is stably operated with respect to input noise.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A data reading circuit for a semiconductor memory device having a memory cell array, comprising:

latching sense amplifier means for receiving data signals DATA and DATAB from the memory cell array and latchingly outputting an output data signal SO in accordance therewith;

current mirror type sense amplifier means for receiving data signals DATA and DATAB from the memory cell array and outputting an output data signal SOM in accordance therewith;

signal delay means for delaying the output data signal SO from the latching sense amplifier to output a delayed signal DEO;

comparing means for comparing the delayed signal DEO from the signal delay means with the output data signal SOM from the current mirror type sense amplifier means and outputting a comparison signal COM in accordance with such comparison;

pulse generator means for receiving the comparison signal COM from the comparing means and outputting a pulse signal DLD in accordance therewith;

controller means for receiving address transition detection signals and outputting sense amplifier control signals in response thereto for controlling the current mirror type sense amplifier means; and combination means for receiving the pulse signal DLD from the pulse generator means and the sense amplifier control signals from the controller means and outputting latching sense amplifier control signals in response thereto for controlling the latching sense amplifier means.

2. The data reading circuit according to claim 1, wherein the sense amplifier control signals output by the controller means comprise a sense amplifier equalization signal EQ and a sense amplifier enable signal EN.

3. The data reading circuit according to claim 1, wherein the latching sense amplifier control signals output by the combination means comprise a latching sense amplifier equalization signal SAEQ and a latching sense amplifier enable signal SAEN.

4. The data reading circuit according to claim 1, wherein the latching sense amplifier means comprises:

first and second PMOS transistors having respective gates thereof commonly connected for receiving a latching sense amplifier enabling signal from the combination means, and having respective sources thereof each connected for receiving a power supply voltage VCC;

third and fourth PMOS transistors having respective gates thereof connected to respective drains of the first and second PMOS transistors, respectively, and having respective sources thereof each connected for receiving the power supply voltage VCC, a drain of the third PMOS transistor being connected with the gate of the fourth PMOS transistor, and a drain of the fourth PMOS transistor being connected to the gate of the third PMOS transistor;

a first NMOS transistor having a drain thereof connected commonly with the drains of the second and third PMOS transistors and the gate of the fourth PMOS transistor, and having a gate thereof connected commonly with the gate of the third PMOS transistor and with the drains of the first and fourth PMOS transistors;

a second NMOS transistor having a drain thereof connected commonly with the drains of the first and fourth PMOS transistors and the gate of the third PMOS transistor, and having a gate thereof connected commonly with the gate of the fourth PMOS transistor, the drains of the second and third PMOS transistors and the drain of the first NMOS transistor;

a third NMOS transistor having a drain thereof connected with a source of the first NMOS transistor, and having a gate thereof connected for receiving the data signal DATA from the memory cell array;

a fourth NMOS transistor having a drain thereof connected with a source of the second NMOS transistor, and having a gate thereof connected for receiving the data signal DATAB from the memory cell array;

a fifth NMOS transistor having a drain thereof commonly connected with respective sources of the third and fourth NMOS transistors, having a gate thereof connected for receiving a latching sense amplifier enable signal SAEN from the combination means, and having a source thereof connected for receiving a ground voltage VSS; and an inverter means having an input terminal thereof connected with the gate of the second NMOS transistor, for outputting the output data signal SO at an output terminal thereof.

5. The data reading circuit according to claim 1, wherein the current mirror type sense amplifier means comprises:

a first PMOS transistor a gate and drain of which are commonly connected, and a source of which is connected for receiving a power supply voltage VCC;

a second PMOS transistor a gate of which is connected commonly with the gate and drain of the first PMOS transistor, and a source of which is connected for receiving the power supply voltage VCC;

a first inverter means for inverting a sense amplifier equalization signal from the controller means;

a transmission gate connected between the drain of the first PMOS transistor and a drain of the second PMOS transistor, and controlled by the sense amplifier equalization signal EQ and an output signal of the first inverter means;

a first NMOS transistor a gate of which is connected for receiving the data signal DATA from the memory cell array, and a drain of which is connected with the drain of the first PMOS transistor;

a second NMOS transistor a gate of which is connected for receiving the data signal DATAB from the memory cell array, and a drain of which is connected with the drain of the second PMOS transistor;

a third NMOS transistor a gate of which is connected for receiving a sense amplifier enable signal EN from the controller means, a drain of which is commonly connected with respective sources of the first and second NMOS transistors, and a source of which is connected for receiving a ground voltage VSS; and second and third inverter means connected in series with an output of the transmission gate means via a common connection point between the drain of the second PMOS transistor and the drain of the second NMOS transistor, for outputting the output data signal SOM.

6. The data reading circuit according to claim 1, wherein the signal delay means comprises:

a plurality of inverters connected in series with one another, the output data signal SO from the latching sense amplifier means being applied to an input of a first one of said inverters and the. delayed signal DEO being output from a last one of said inverters; and a plurality of NMOS transistors each connected at a respective gate thereof to a corresponding series connection point between adjacent ones of said plurality of inverters and each having a source and drain thereof commonly connected for receiving a ground voltage VSS.

7. The data reading circuit according to claim 1, wherein the signal delay means comprises:

a plurality of inverters connected in series with one another, the output data signal SO from the latching sense amplifier means being applied to an input of a first one of said inverters and the delayed signal DEO being output from a last one of said inverters; and a plurality of PMOS transistors each connected at a respective gate thereof to a corresponding series connection point between adjacent ones of said plurality of inverters and each having a source and drain thereof commonly connected for receiving a power supply voltage VCC.

8. The data reading circuit according to claim 1, wherein the comparing means comprises:

a PMOS transistor a source of which is connected for receiving a power supply voltage VCC and a gate of which is connected for receiving a delayed address transition detection signal ATDL;

a first NMOS transistor a source of which is connected for receiving a ground voltage VSS and a gate of which is connected for receiving an inverted delayed address transition detection signal /ATDL;

an exclusive-OR gate a first input terminal of which is connected with a drain of the PMOS transistor, a second input terminal of which is connected with a drain of the first NMOS transistor, to respective ??? input terminals of which are applied the delayed signal DEO from the signal delay means and the output data signal SOM from the current mirror type sense amplifier means, and at an output terminal of which is produced the comparison signal COM; and a second NMOS transistor a gate of which is connected for receiving the delayed address transition detection signal ATDL, a source of which is connected for receiving the ground voltage VSS, and a drain of which is connected to the output terminal of the exclusive-OR gate.

9. The data reading circuit according to claim 1, wherein the comparing means comprises:

first NAND gate means for NANDing the delayed signal DEO from the signal delay means with the output data signal SOM from the current mirror type sense amplifier means;

NOR gate means for NORing the delayed signal DEO from the signal delay means with the output data signal SOM from the current mirror type sense amplifier means;

inverter means for inverting an output signal of the NOR gate means;

second NAND gate means for NANDing an output signal of the first NAND gate means with an output signal of the inverter means;

a first PMOS transistor a source of which is connected for receiving a power supply voltage VCC and a gate of which is connected for receiving a delayed address transition detection signal ATDL;

a second PMOS transistor a source of which is connected with a drain of the first PMOS transistor and a gate of which is connected for receiving an output signal of the second NAND gate means;

a first NMOS transistor a gate of which is connected for receiving the output signal of the second NAND gate means and a drain of which is connected with a drain of the second PMOS transistor, the comparison signal COM being output at the common connection between the drains of the second PMOS transistor and first NMOS transistor;

a second NMOS transistor a source of which is connected for receiving a ground voltage VSS, a gate of which is connected for receiving an inverted delayed address transition detection signal /ATDL and a drain of which is connected to a source of the first NMOS transistor; and a third NMOS transistor a gate of which is connected for receiving the delayed address transition detection signal ATDL, a source of which is connected for receiving the ground voltage VSS, and a drain of which is connected to the commonly connected drains of the second PMOS transistor and first NMOS transistor.

10. The data reading circuit according to claim 1, wherein the comparison signal COM is output by the comparing means with a low logic level when the output data signal SOM from the current mirror type sense amplifier means and the delayed signal DEO from the signal delay means are identical with one another, and wherein the comparison signal COM is output by the comparing means with a high logic level when the output data signal SOM and the delayed signal DEO differ from one another.

11. The data reading circuit according to claim 1, wherein the pulse generator means comprises:

a delay means for delaying the comparison signal COM output from the comparing means; and a NAND gate for NANDing the comparison signal COM output from the comparing means with an output signal of the delay means for thereby outputting the pulse signal DLD.

12. The data reading circuit according to claim 11, wherein the delay means comprises a plurality of inverters connected in series for sequentially inverting the comparison signal COM outputted by the comparing means.

13. The data reading circuit according to claim 1, wherein the pulse generator means outputs the pulse signal DLD with a high logic level when the comparison signal COM outputted by the comparing means has a low logic level.

14. The data reading circuit according to claim 1, wherein the combination means comprises:

first NAND gate means for NANDing a sense amplifier equalization signal EQ outputted by the controller means with the pulse signal DLD outputted by pulse generator means;

first inverter means for inverting an output signal of the first NAND gate means for outputting a latching sense amplifier equalization signal SAEQ;

second NAND gate means for NANDing a sense amplifier enable signal EN outputted by the controller means with the pulse signal DLD outputted by pulse generator means; and second inverter means for inverting an output signal of the second NAND gate means for outputting a latching sense amplifier enable signal SAEN.

* * * * *